United States Patent
Lim et al.

(10) Patent No.: US 9,153,756 B2
(45) Date of Patent: Oct. 6, 2015

(54) LIGHT-EMITTING DEVICE

(71) Applicant: LG INNOTEK CO., LTD., Seoul (KR)

(72) Inventors: Hyun Soo Lim, Seoul (KR); Kwon Tae Cho, Seoul (KR); Su Ik Park, Seoul (KR)

(73) Assignee: LG Innotek Co., Ltd., Seoul (KR)

( * ) Notice: Subject to any disclaimer, the term of this patent is extended or adjusted under 35 U.S.C. 154(b) by 182 days.

(21) Appl. No.: 13/713,923

(22) Filed: Dec. 13, 2012

(65) Prior Publication Data

US 2013/0153947 A1 Jun. 20, 2013

(30) Foreign Application Priority Data

Dec. 16, 2011 (KR) .................. 10-2011-0136834

(51) Int. Cl.
- *H01L 33/00* (2010.01)
- *H01L 33/58* (2010.01)
- *H01L 33/22* (2010.01)
- *H01L 33/44* (2010.01)
- *H01L 33/20* (2010.01)

(52) U.S. Cl.
CPC ............... *H01L 33/58* (2013.01); *H01L 33/22* (2013.01); *H01L 33/44* (2013.01); *H01L 33/20* (2013.01); *H01L 2224/48091* (2013.01); *H01L 2933/0083* (2013.01); *H01L 2933/0091* (2013.01)

(58) Field of Classification Search
CPC .................. H01L 51/5262; H01L 51/5271
USPC ............................................. 257/98; 438/29
See application file for complete search history.

(56) References Cited

U.S. PATENT DOCUMENTS

| | | | |
|---|---|---|---|
| 2005/0230699 A1* | 10/2005 | Wu et al. | 257/98 |
| 2009/0052159 A1 | 2/2009 | Abe et al. | |
| 2010/0006878 A1 | 1/2010 | Kim et al. | |
| 2010/0264443 A1 | 10/2010 | Wakai et al. | |
| 2011/0186857 A1* | 8/2011 | Kang | 257/76 |
| 2011/0254036 A1* | 10/2011 | Kim et al. | 257/98 |
| 2012/0043568 A1* | 2/2012 | Yan et al. | 257/98 |
| 2012/0267656 A1* | 10/2012 | Kuo et al. | 257/98 |

FOREIGN PATENT DOCUMENTS

EP 2 234 182 A1 9/2010

* cited by examiner

*Primary Examiner* — Daniel Whalen
(74) *Attorney, Agent, or Firm* — Birch, Stewart, Kolasch & Birch, LLP

(57) ABSTRACT

A light-emitting device, a method of fabricating the light-emitting device, a light-emitting device package and a lighting system are provided. The light-emitting device may include a substrate 105; a first conductivity type semiconductor layer 12 disposed on the substrate 105; an active layer 114 disposed on the first conductivity type semiconductor layer 12; a second conductivity type semiconductor layer 16 disposed on the active layer 114; a first electrode 131 disposed on the first conductivity type semiconductor layer 112; a second electrode 132 disposed on the second conductivity type semiconductor layer 116; a first light extraction pattern P provided on a top surface of the substrate 105; and a second light extraction pattern 150 provided on sides of the substrate 105.

12 Claims, 12 Drawing Sheets

LIGHT-EMITTING DEVICE

CROSS-REFERENCE TO RELATED APPLICATION(S)

This application claims priority under 35 U.S.C. §119 from Korean Patent Application No. 10-2011-0136834, filed on Dec. 16, 2011, in the Korean Intellectual Property Office, the disclosure of which is incorporated herein by reference in its entirety.

BACKGROUND

1. Field

Embodiments relate to a light-emitting device.

2. Description of the Related Art

Light-emitting devices are devices that convert electric energy into light energy and are capable of realizing various colors by adjusting the composition ratio of compound semiconductors.

When a forward voltage is applied, electrons from an n layer and holes from a p layer are combined to emit energy corresponding to an energy gap between a conduction band and a valence band. The energy is generally emitted in the form of heat or light. In light-emitting devices, in particular, the energy is emitted in the form of light.

Nitride semiconductors, for example, are attracting much attention for the fields of optical devices and high power electronic devices because of their high thermal stability and wide band gap energy. In particular, blue light-emitting devices, green light-emitting devices, and ultraviolet (UV) light-emitting devices that use nitride semiconductors have been commercialized and are widely used.

In related-art lateral light-emitting diodes (LEDs), a GaN epitaxial layer is grown on a patterned sapphire substrate, and p- and n-electrodes are formed with the use of a mesa structure.

The distribution of light in a related-art lateral LED shows that about 30% of light is emitted from the top of a GaN epitaxial layer and about 70% of the light is emitted from the bottom of a patterned sapphire substrate. More specifically, in a related-art lateral LED, most light is emitted from the bottom of the patterned sapphire substrate at a predetermined angle. That is, due to the total reflection caused by the difference between the refractive index of the patterned sapphire substrate and the refractive index of the air, most of the light beyond a predetermined critical angle cannot be emitted regardless of the presence of the patterned sapphire substrate.

SUMMARY

Embodiments provide a light-emitting device with improved light extraction efficiency, a method of fabricating the light-emitting device, a light-emitting device package and a lighting system.

In one embodiment, a light-emitting device includes: a substrate; a light-emitting structure disposed on the substrate; electrodes formed on the light-emitting structure; and a light extraction pattern provided on sides of the substrate, wherein the light extraction pattern includes a different material from the substrate.

In another embodiment, a light-emitting device includes: a substrate 105; a first conductivity type semiconductor layer 12 disposed on the substrate 105; an active layer 114 disposed on the first conductivity type semiconductor layer 12; a second conductivity type semiconductor layer 16 disposed on the active layer 114; a first electrode 131 disposed on the first conductivity type semiconductor layer 112; a second electrode 132 disposed on the second conductivity type semiconductor layer 116; a first light extraction pattern P provided on a top surface of the substrate 105; and a second light extraction pattern 150 provided on sides of the substrate 105.

A light-emitting device, a method of fabricating the light-emitting device, a light-emitting device package and a lighting system according to embodiments may improve light extraction efficiency.

BRIEF DESCRIPTION OF THE DRAWINGS

The above and/or other aspects will be more apparent by describing certain exemplary embodiments with reference to the accompanying drawings, in which.

DETAILED DESCRIPTION OF THE EXEMPLARY EMBODIMENTS

Hereinafter, a light-emitting device, a method of fabricating the light-emitting device, a light-emitting device package and a lighting system according to embodiments will be described with reference to the accompanying drawings.

In the description of the embodiments, it will be understood that, when a layer (or film), a region, a pattern, or a structure is referred to as being "on" or "under" another substrate, another layer (or film), another region, another pad, or another pattern, it can be "directly" or "indirectly" over the other substrate, layer (or film), region, pad, or pattern, or one or more intervening layers may also be present. Such a position of the layer has been described with reference to the drawings. The thickness and size of each layer shown in the drawings may be exaggerated, omitted or schematically drawn for the purpose of convenience or clarity. In addition, the size of elements does not utterly reflect an actual size.

Figure 1:
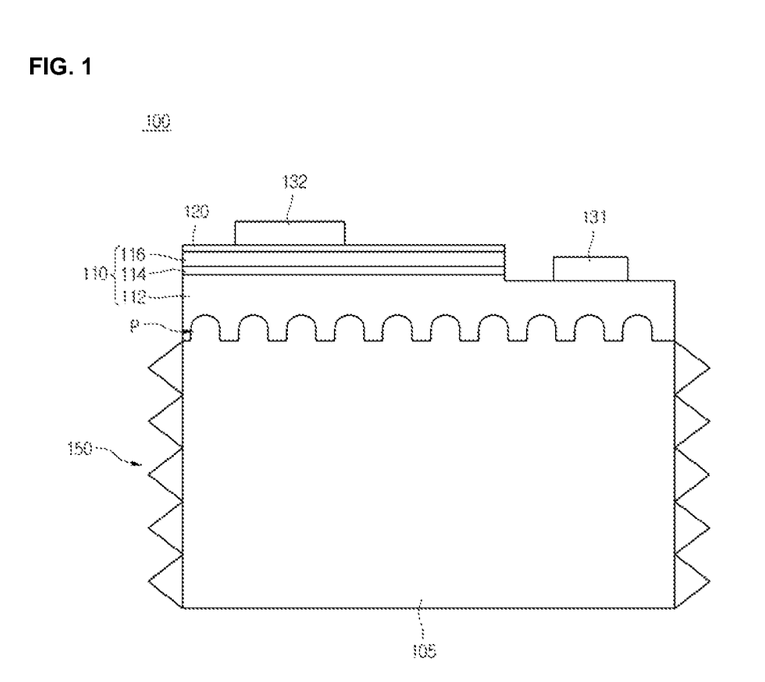
FIG. 1 is a cross-sectional view illustrating a light-emitting device according to a first embodiment.

FIG. 1 is a cross-sectional view illustrating a light-emitting device 100 according to a first embodiment.

The light-emitting device 100 includes a substrate 105, a light-emitting structure 110 disposed on the substrate 105, electrodes formed on the light-emitting structure 110 and a second light extraction pattern 150 disposed on sides of the substrate 105, and the second light extraction pattern 150 may include a different material from the substrate 105.

The light-emitting structure 110 may include a first conductivity type semiconductor layer 112 disposed on the substrate 105, an active layer 114 disposed on the first conductivity type semiconductor layer 112, and a second conductivity type semiconductor layer 116 disposed on the active layer 114. The electrodes may include a first electrode 131 disposed on a part of the first conductivity type semiconductor layer 112 that is exposed by partially removing the second conductivity type semiconductor layer 116 and the active layer 114; and a second electrode 132 disposed on the second conductivity type semiconductor layer 116.

The refractive index of the second light extraction pattern 150 may be greater than the refractive index of the substrate 105 so as to prevent total reflection and thus to improve light extraction efficiency. For example, the second light extraction pattern 150 may be formed of a silicone material, etc.

The second light extraction pattern 150 may be formed of a transmissive material, i.e., a material that transmits light there through, instead of reflecting light, so as to emit light.

The size of the second light extraction pattern 150 may be about 1/10 to about 1/5 of the thickness of the substrate 105 so as to effectively extract emitted light. For example, in response to the thickness of the substrate 105 being about 100 μm, the second light extraction pattern 150 may have, but is not limited to, a size of about 10 μm to about 20 μm.

In a case in which the second light extraction pattern 150 is arranged on the bottom surface of the substrate 105 in the form of parallel lines, the second light extraction pattern 150 may increase the lateral diffused reflection of light so as to improve lateral light extraction efficiency.

The second light extraction pattern 150 may be attached onto the sides of the substrate 105 or the light-emitting structure 110 by, for example, thermal treatment or the use of an adhesive material or pressure.

Figure 2:
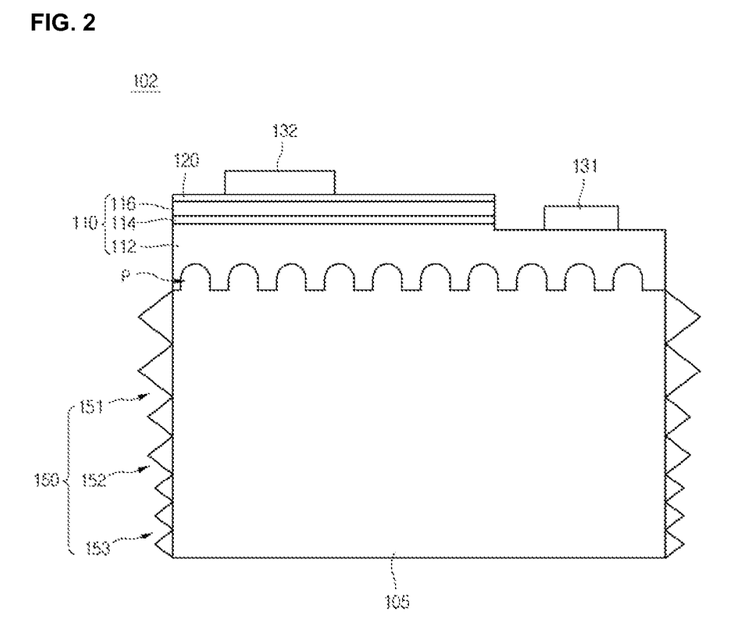
FIG. 2 is a cross-sectional view illustrating a light-emitting device according to a second embodiment.

FIG. 2 is a cross-sectional view illustrating a light-emitting device 102 according to a second embodiment.

The second embodiment may employ the technical features of the first embodiment.

In the second embodiment, a second light extraction pattern 150 may include a first pattern 151, a second pattern 152, and a third pattern 153, and the first pattern 151, the second pattern 152, and the third pattern 153 may have different sizes.

For example, the size of the first pattern 151 may be greater than the size of the second pattern 152, and the first pattern 151 may be disposed closer than the second pattern 152 to an active layer 114. In this example, since light extraction patterns of various sizes, periods, or heights are provided, it is possible to provide an appropriate light extraction structure for diffused reflected light and thus to improve light extraction efficiency.

The second pattern 152 and the third pattern 153 may be formed more densely than the first pattern 151 so that the optical output may be increased even in areas relatively distant from the active layer 114.

According to the second embodiment, it is possible to improve light extraction efficiency by varying the shape of the second light extraction pattern 150.

Figure 3:
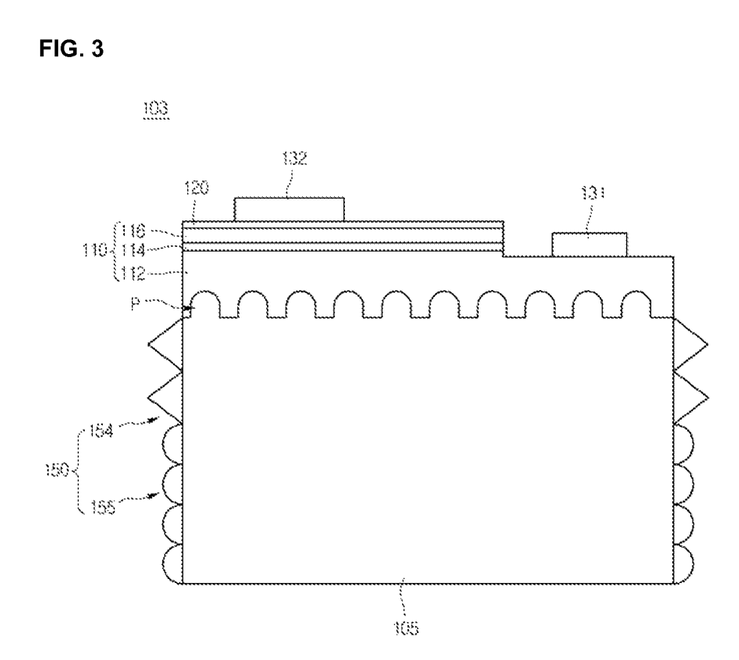
FIG. 3 is a cross-sectional view illustrating a light-emitting device according to a third embodiment.

FIG. 3 is a cross-sectional view illustrating a light-emitting device 103 according to a third embodiment.

The third embodiment may employ the technical features of the first and second embodiments.

In the third embodiment, a second light extraction pattern 150 may include a fourth pattern 154 and a fifth pattern 155, and the fourth pattern 154 and the fifth pattern 155 may have different shapes and may thus contribute to the improvement of light extraction efficiency.

For example, the fourth pattern 154 may have a triangular shape, and the fifth pattern 155 may have a semicircular shape. Accordingly, it is possible to provide an optimum optical extraction condition by providing a light extraction structure with patterns of various periods and heights.

Figure 4:
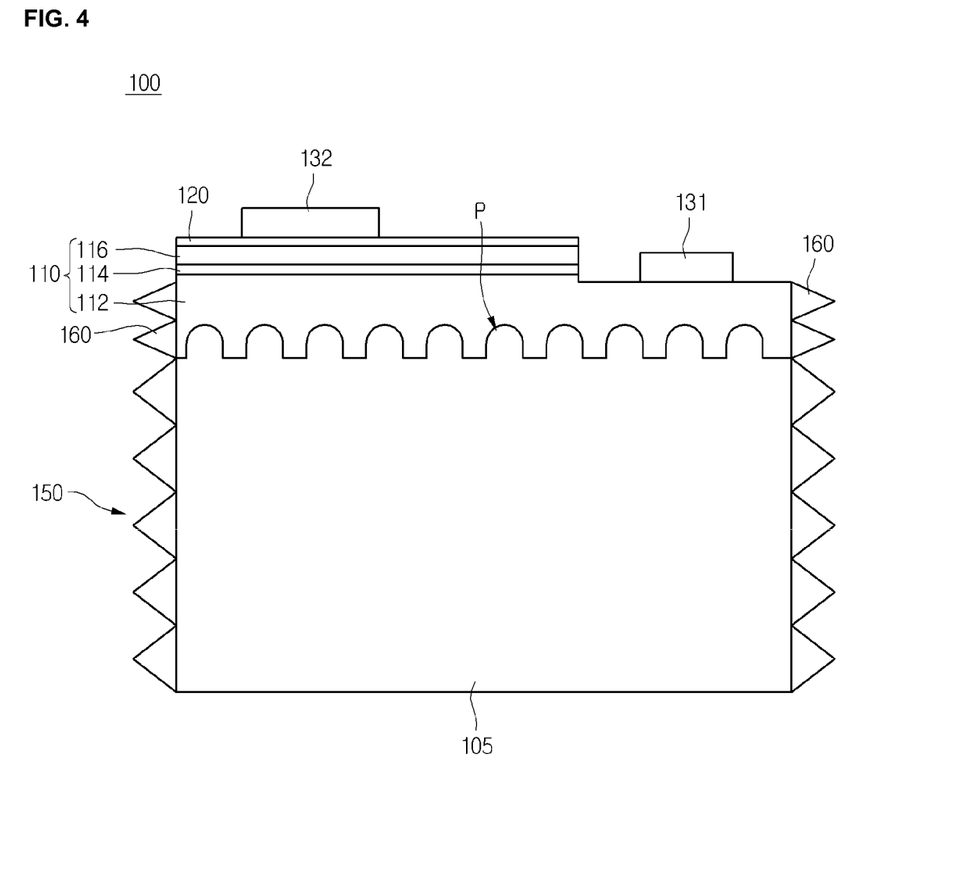
FIG. 4 is a cross-sectional view illustrating a light-emitting device according to a fourth embodiment.

FIG. 4 is a cross-sectional view illustrating a light-emitting device 104 according to a fourth embodiment.

The fourth embodiment may employ the technical features of the first, second, and third embodiments.

In the fourth embodiment, a light-emitting device 104 may also include a third light extraction pattern 160, which is formed on the sides of a light-emitting structure 110. For example, the third light extraction pattern 160 may be formed on the sides of a first conductivity type semiconductor layer 112 so as to improve light extraction efficiency.

The third light extraction pattern 160 may be formed of the same material as a second light extraction pattern 150. For example, the third light extraction pattern 160 may include, but is not limited to, a silicone material.

The third light extraction pattern 160 may be formed of a different material from the second light extraction pattern 150. For example, the third light extraction pattern 160 may be formed by etching the sides of the first conductivity type semiconductor layer 112.

Figure 5:
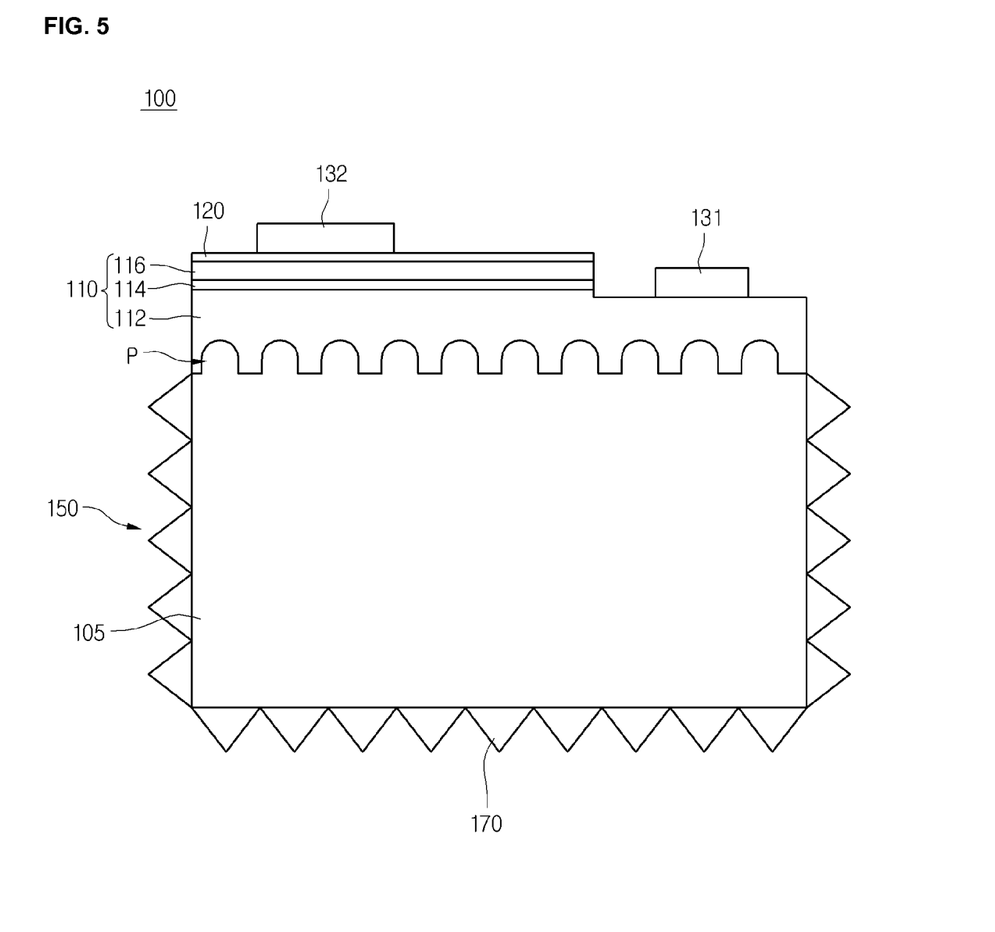
FIG. 5 is a cross-sectional view illustrating a light-emitting device according to a fifth embodiment.

FIG. 5 is a cross-sectional view illustrating a light-emitting device 105 according to a fifth embodiment.

The fifth embodiment may employ the technical features of the first, second, third, fourth and fifth embodiments.

In the fifth embodiment, the light-emitting device 105 may also include a fourth light extraction pattern 170 formed on the bottom surface of a substrate 105. Accordingly, in response to the light-emitting device 105 being mounted as a flip chip, the fourth light extraction pattern 170 may contribute to the improvement of light extraction efficiency at the bottom of the substrate 105 (i.e., the top of a light-emitting device package).

The fourth light extraction pattern 170 may be formed of a different material from the substrate 105. For example, the fourth light extraction pattern 170 may be formed of the same material as a second light extraction pattern 150.

The fourth light extraction pattern 170 may include the same material as the substrate 105. For example, the fourth light extraction pattern 170 may be formed by etching the bottom surface of the substrate 105.

The fourth light extraction pattern 170 may be vertically aligned with the first light extraction pattern P. Or the fourth light extraction pattern 170 may be vertically misaligned with the first light extraction pattern P.

Also, the fourth light extraction pattern 170 may include a different shape patterns comparing to the first light extraction pattern P. And, the fourth light extraction pattern 170 may include the same shape patterns comparing to the second light extraction pattern 150.

Figure 6A:
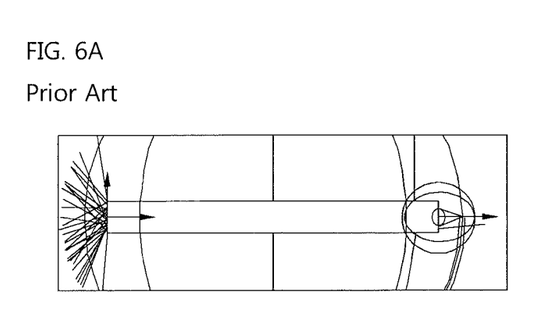
FIG. 6A is a diagram illustrating an example of the path of light in a related-art light-emitting device.
Figure 6B:
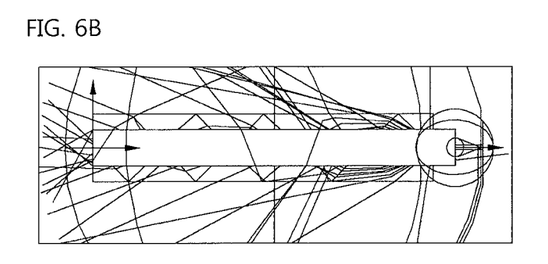
FIG. 6B is a diagram illustrating an example of the path of light in a light-emitting device according to an embodiment.

FIG. 6A is a diagram illustrating an example of the path of light in a related-art light-emitting device, and FIG. 6B is a diagram illustrating an example of the path of light in a light-emitting device according to an embodiment.

Referring to FIGS. 6A and 6B, in a light-emitting device according to an embodiment, having a second light extraction pattern 150 disposed on the sides of a sapphire substrate 105 and formed of a different material from the sapphire substrate 105, a considerable amount of light is extracted not only from the bottom of the sapphire substrate 105 but also from the sides of the sapphire substrate 105, while in a related-art light-emitting device, most light is emitted from the bottom of a sapphire substrate.

Figure 7A:
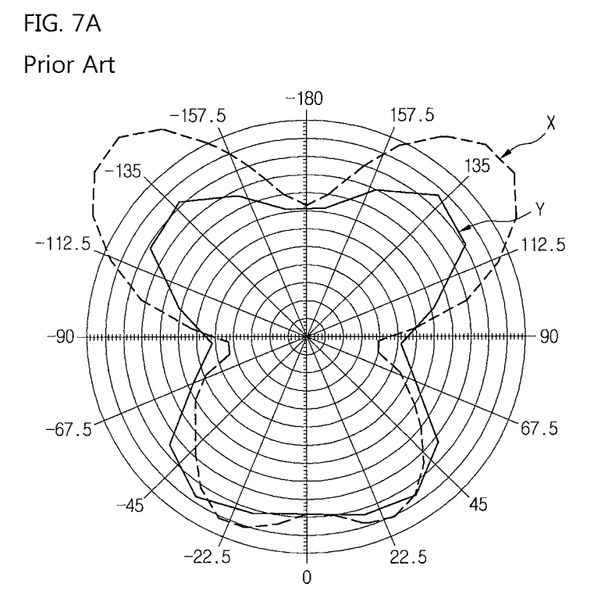
FIG. 7A is a diagram illustrating an example of the distribution of light in a related-art light-emitting device.
Figure 7B:
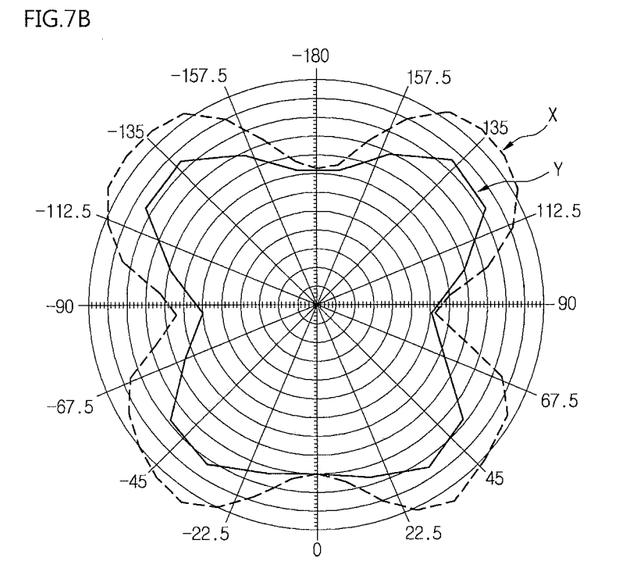
FIG. 7B is a diagram illustrating an example of the distribution of light in a light-emitting device according to an embodiment.

FIG. 7A is a diagram illustrating an example of the distribution of light in a related-art light-emitting device, and FIG. 7B is a diagram illustrating an example of the distribution of light in a light-emitting device according to an embodiment. Referring to FIGS. 7A and 7B, X shows the distribution of light along a first axis of the light-emitting device according to an embodiment, and Y shows the distribution of light along a second axis, which is perpendicular to the first axis.

Figure 8A:
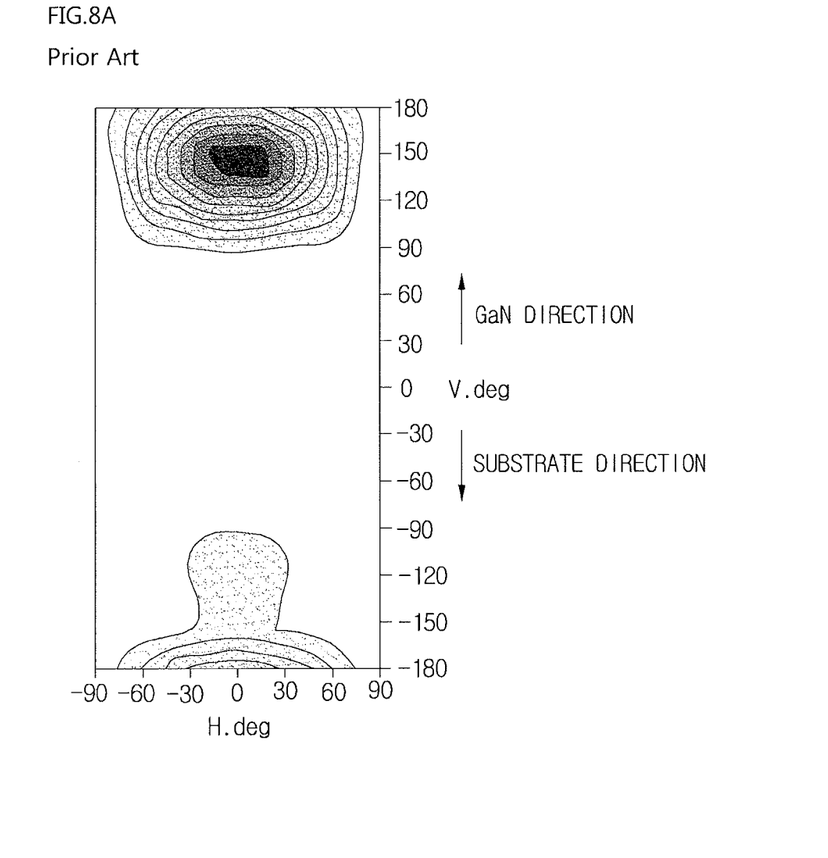
FIG. 8A is a diagram illustrating an example of the distribution of near-field light on the sides of the substrate of a related-art light-emitting device.
Figure 8B:
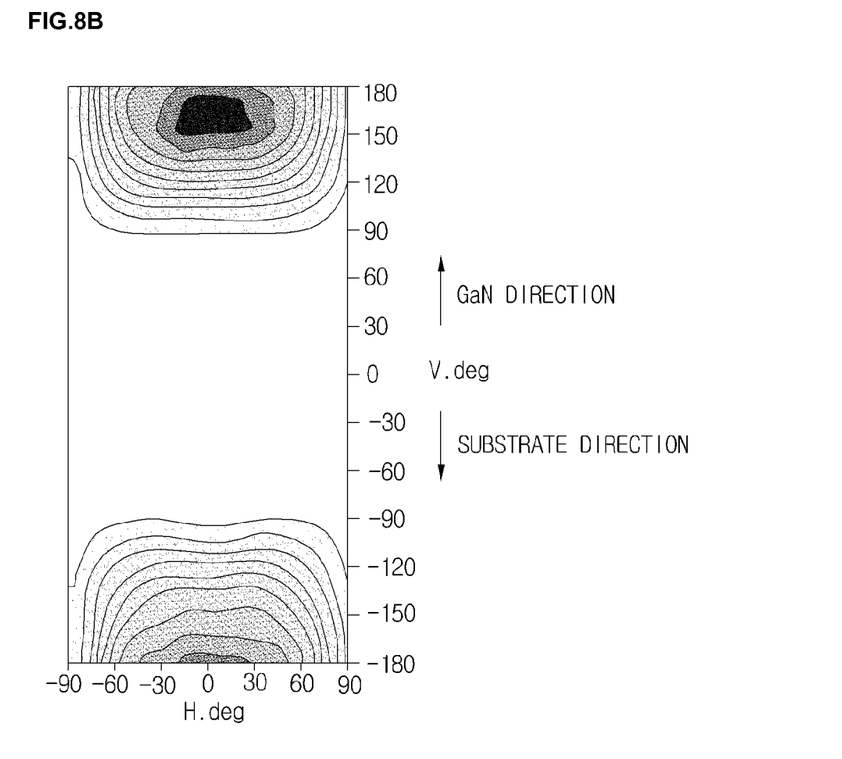
FIG. 8B is a diagram illustrating an example of the distribution of near-field light on the sides of the substrate of a light-emitting device according to an embodiment.

FIG. 8A is a diagram illustrating an example of the distribution of near-field light on the sides of the substrate of a related-art light-emitting device, and FIG. 8B is a diagram illustrating an example of the distribution of near-field light on the sides of the substrate of a light-emitting device according to an embodiment.

As illustrated in FIGS. 7A, 7B, 8A, and 8B, the amount of light emitted from the chip of the light-emitting device according to an embodiment is generally increased as compared to a related-art light emitting device, and a considerable amount of light is emitted even from the sides of the sapphire substrate of the light-emitting device according to an embodiment.

Simulation results show that the light extraction efficiencies before and after patterning are 58.5% and 67.8%, respectively. Accordingly, the light-emitting device according to an embodiment is expected to achieve an increase of about 16% in luminosity.

According to embodiments, it is possible to improve light extraction efficiency.

A method of fabricating a light-emitting device according to an embodiment will hereinafter be described with reference to FIGS. 9 to 11.

Figure 9:
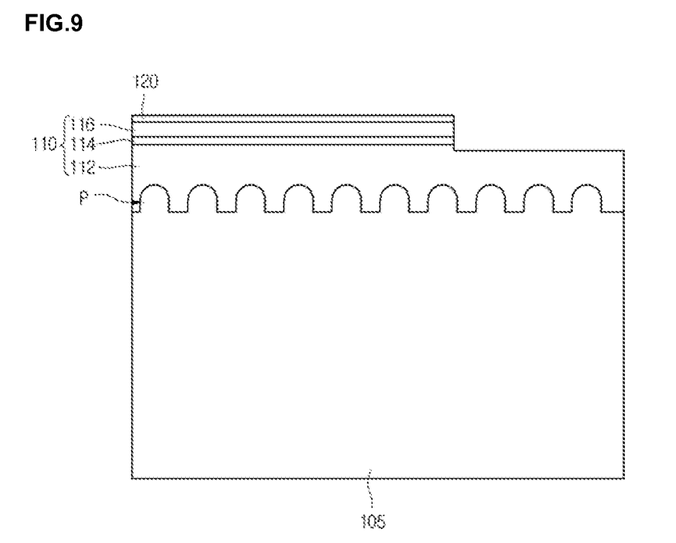
FIGS. 9 to 11 are cross-sectional views illustrating a method of fabricating a light-emitting device, according to an embodiment.

Referring to FIG. 9, a substrate 105 may be prepared. The substrate 105 may include a conductive substrate or an insulating substrate. For example, the substrate 105 may be at least one of sapphire ($Al_2O_3$), SiC, Si, GaAs, GaN, ZnO, GaP, InP, Ge, and $Ga_2O_3$. Wet cleaning may be performed on the substrate 105 in order to remove impurities from the surface of the substrate 105.

A first light extraction pattern P may be formed on the substrate 105. The first light extraction pattern P may be formed of the same material as the substrate 105. For example, the first light extraction pattern P may include, but is not limited to, a patterned sapphire substrate (PSS) formed on the substrate 105.

Thereafter, a buffer layer (not shown) may be formed on the substrate 105. The buffer layer may alleviate any misalignment between the material of the light-emitting structure 110 and the substrate 105. The buffer layer may be formed of a group III-V compound semiconductor, for example, at least one of GaN, InN, AlN, InGaN, AlGaN, InAlGaN, and AlInN.

Thereafter, the light-emitting structure 110 may be formed on the buffer layer. The light-emitting structure 110 may include the first conductivity type semiconductor layer 112, the active layer 114 and the second conductivity type semiconductor layer 116.

The first conductivity type semiconductor layer 112 may be formed of a group III-V compound semiconductor doped with a first conductivity type dopant. In response to the first conductivity type semiconductor layer 112 being an N-type semiconductor layer, the first conductivity type dopant may be an N-type dopant, and may include Si, Ge, Sn, Se and Te.

The first conductivity type semiconductor layer 112 may include a semiconductor material of the composition $In_xAl_yGa_{1-x-y}N$ ($0 \leq x \leq 1$, $0 \leq y \leq 1$, $0 \leq x+y \leq 1$). For example, the first conductivity type semiconductor layer 112 may be formed of at least one of GaN, InN, AlN, InGaN, AlGaN, InAlGaN, AlInN, AlGaAs, InGaAs, AlInGaAs, GaP, AlGaP, InGaP, AlInGaP, and InP.

The first conductivity type semiconductor layer 112 may be formed by forming an N-type GaN layer with the use of chemical vapor deposition (CVD), molecular beam epitaxy (MBE), sputtering, hydride vapor phase epitaxy (HVPE), etc. The first conductivity type semiconductor layer 112 may also be formed by injecting a trimethyl gallium gas (TMGa), an ammonia gas ($NH_3$), a nitrogen gas ($N_2$) and a silane gas ($SiH_4$) containing n-type impurities such as silicon (Si) into a chamber.

A current spreading layer (not shown) may be formed on the first conductivity type semiconductor layer 112. The current spreading layer may be, but is not limited to, an undoped GaN layer. The current spreading layer may be formed to, but is not limited to, a thickness of 50 nm to 200 nm.

An electron injection layer may be formed on the current spreading layer. The electron injection layer may be a first conductivity type gallium nitride layer. For example, for an effective electron injection, the electron injection layer may be doped with an n-type doping element at a concentration of $6.0 \times 10^{18}$ atoms/$cm^3$ to $8.0 \times 10^{18}$ atoms/$cm^3$.

A strain control layer (not shown) may be formed on the electron injection layer. For example, the strain control layer may be formed of $In_yAl_xGa_{(1-x-y)}N$ ($0 \leq x \leq 1$, $0 \leq y \leq 1$)/GaN. The strain control layer may effectively alleviate unusual stress that may be caused by any misalignment between the first conductivity type semiconductor layer 112 and the active layer 114.

The strain control layer may be repeatedly deposited at least every six cycles. As a result, more electrons may gather at low energy levels of the active layer 114, and thus, electrons and holes may become more likely to recombine. Accordingly, light-emitting efficiency may be improved.

Thereafter, the active layer 114 is formed on the strain control layer.

The active layer 114 may emit light corresponding to an amount of energy determined by the inherent energy band of the material of the active layer 114 upon electrons injected through the first conductivity type semiconductor layer 112 encountering holes injected through the second conductivity type semiconductor layer 116.

The active layer 114 may be formed to have at least one of a single quantum well structure, a multi-quantum well (MQW) structure, a quantum-wire structure and a quantum dot structure. For example, the active layer 114 may have, but is not limited to, a MQW structure obtained by injecting TMGa, an ammonia gas ($NH_3$), a nitrogen gas ($N_2$), and a trimethyl indium gas (TMIn).

A well layer/barrier layer of the active layer 114 may have, but is not limited to, a pair structure obtained by using at least one of InGaN/GaN, InGaN/InGaN, GaN/AlGaN, InAlGaN/GaN, GaAs(InGaAs)/AlGaAs, and GaP(InGaP)/AlGaP. The well layer may be formed of a material having a smaller band gap than that of the barrier layer.

An electron blocking layer (not shown) is formed on the active layer 114. The electron blocking layer may block electrons and may also serve as a MQW cladding layer for the active layer 114, thereby improving light-emitting efficiency.

For example, the electron blocking layer may be formed of a $Al_xIn_yGa_{(1-x-y)}N$ (0≤x≤1, 0≤y≤1)-based semiconductor. For example, the electron blocking layer may have a greater energy band gap than that of the active layer 114, and may be formed to a thickness of about 100 Å to about 600 Å.

The electron blocking layer may be formed as, but is not limited to, an $Al_zGa_{(1-z)}N/GaN$ (0≤z≤1) superlattice.

The electron blocking layer may efficiently block overflown electrons from a p-type ion implantation, and may improve the efficiency of implantation of holes. For example, the electron blocking layer may efficiently block overflown electrons from an ion implantation performed with a Mg concentration of about $10^{18}$ to $10^{20}/cm^3$, and may improve the efficiency of implantation of holes.

The second conductivity type semiconductor layer 116 may include a group III-V compound semiconductor doped with a second conductivity type dopant, for example, a semiconductor material of the composition $In_xAl_yGa_{1-x-y}N$ (0≤x≤1, 0≤y≤1, 0≤x+y≤1). In response to the second conductivity type semiconductor layer 116 being a P-type semiconductor layer, the second conductivity type dopant may be a P-type dopant, and may include Mg, Zn, Ca, Sr, Ba, etc.

The second conductivity type semiconductor layer 116 may be formed as, but is not limited to, a P-type GaN layer obtained by injecting a TMGa, an ammonia gas ($NH_3$), a nitrogen gas ($N_2$) and bis(ethylcyclopentadienyl)magnesium containing p-type impurities such as Mg into a chamber.

The first conductivity type semiconductor layer 112 may be implemented as, but is not limited to an N-type semiconductor layer, and the second conductivity type semiconductor layer 116 may be implemented as, but is not limited to a P-type semiconductor layer. A semiconductor having the opposite polarity to a second conductivity type, for example, an N-type semiconductor layer (not shown), may be formed on the second conductivity type semiconductor layer 116. Accordingly, the light-emitting structure 110 may be configured to have one of an N—P junction structure, a P—N junction structure, a N—P—N junction structure, and a P—N—P junction structure.

A transmissive electrode 120 may be formed on the second conductivity type semiconductor layer 116. For example, for an efficient carrier injection, the transmissive electrode 120 may be formed by depositing a single metal or a metal alloy, a metal oxide, etc. so as to form a multiple layer. For example, the transmissive electrode 120 may be formed of, but is not limited to, at least one of indium tin oxide (ITO), indium zinc oxide (IZO), indium zinc tin oxide (IZTO), indium aluminum zinc oxide (IAZO), indium gallium zinc oxide (IGZO), indium gallium tin oxide (IGTO), aluminum zinc oxide (AZO), antimony tin oxide (ATO), gallium zinc oxide (GZO), IZO nitride (IZON), Al—Ga ZnO (AGZO), In—Ga ZnO (IGZO), ZnO, IrOx, RuOx, NiO, RuOx/ITO, Ni/IrOx/Au, Ni/IrOx/Au/ITO, Ag, Ni, Cr, Ti, Al, Rh, Pd, Ir, Ru, Mg, Zn, Pt, Au, and Hf.

Thereafter, the first conductivity type semiconductor layer 112 may be exposed by removing parts of the transmissive electrode 120, the second conductivity type semiconductor layer 116, and the active layer 114.

Figure 10:
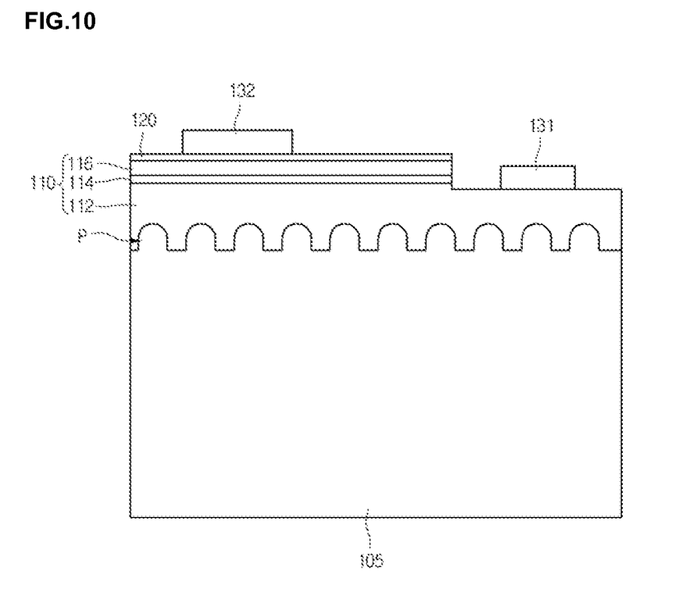

Thereafter, referring to FIG. 10, a first electrode 131 and a second electrode 132 may be formed on an exposed part of the first conductivity type semiconductor layer 112 and the transmissive electrode 120, respectively.

Figure 11:
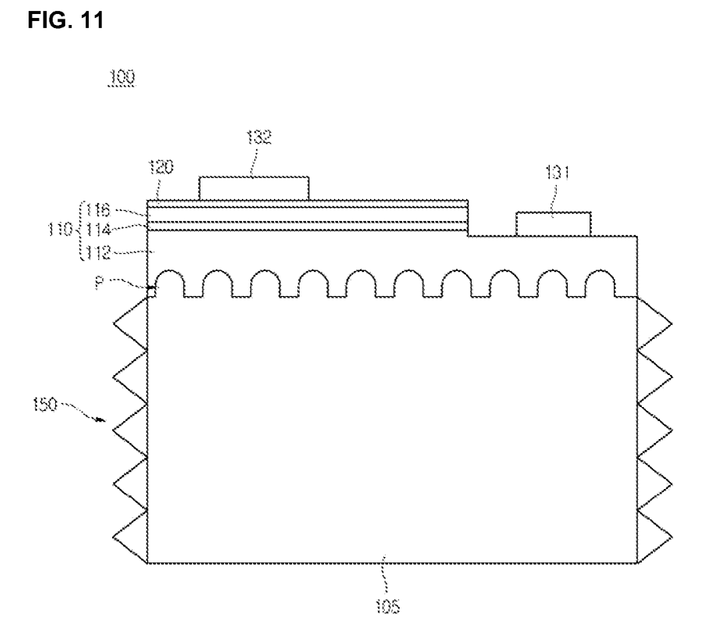

Thereafter, referring to FIG. 11, the second light extraction pattern 150 may be formed on sides of the substrate 105. The formation of the second light extraction pattern 150 may be performed before the formation of the first electrode 131 and the second electrode 132.

The second light extraction pattern 150 may be attached onto the sides of the substrate 105 or the sides of the light-emitting structure 110 by, for example, thermal treatment or the use of an adhesive material or pressure.

The second light extraction pattern 150 may include a different material from the substrate 105.

The refractive index of the second light extraction pattern 150 may be greater than the refractive index of the substrate 105 so as to prevent total reflection and thus to improve light extraction efficiency. For example, the second light extraction pattern 150 may be formed of a silicone material, etc.

The second light extraction pattern 150 may be formed of a transmissive material, i.e., a material that transmits light therethrough, instead of reflecting light, so as to emit light.

The second light extraction pattern 150 may include a plurality of patterns. The patterns may be configured to have different sizes and shapes so as to uniformly extract light.

The size of the second light extraction pattern 150 may be about 1/10 to about 1/5 of the thickness of the substrate 105 so as to effectively extract emitted light. For example, in response to the thickness of the substrate 105 being about 100 μm, the second light extraction pattern 150 may have, but is not limited to, a size of about 10 μm to about 20 μm.

In a case in which the second light extraction pattern 150 is arranged on the bottom surface of the substrate 105 in the form of parallel lines, the second light extraction pattern 150 may increase the lateral diffused reflection of light so as to improve lateral light extraction efficiency.

In the second embodiment illustrated in FIG. 2, the second light extraction pattern 150 may include the first pattern 151, the second pattern 152, and the third pattern 153, and the first pattern 151, the second pattern 152, and the third pattern 153 may have different sizes. According to the second embodiment, it is possible to improve light extraction efficiency by varying the shape of the second light extraction pattern 150.

In the third embodiment, the second light extraction pattern 150 may include the fourth pattern 154 and the fifth pattern 155, and the fourth pattern 154 and the fifth pattern 155 may have different shapes and may thus contribute to the improvement of light extraction efficiency.

In the fourth embodiment, the light-emitting device 104 may also include the third light extraction pattern 160, which is formed on the sides of the light-emitting structure 110. For example, the third light extraction pattern 160 may be formed on the sides of the first conductivity type semiconductor layer 112 so as to improve light extraction efficiency.

The third light extraction pattern 160 may be formed of the same material as the second light extraction pattern 150. For example, the third light extraction pattern 160 may include, but is not limited to, a silicone material.

The third light extraction pattern 160 may be formed of a different material from the second light extraction pattern 150. For example, the third light extraction pattern 160 may be formed by etching the sides of the first conductivity type semiconductor layer 112.

In the fifth embodiment, the light-emitting device 105 may also include the fourth light extraction pattern 170 formed on the bottom surface of the substrate 105. Accordingly, in response to the light-emitting device 105 being mounted as a flip chip, the fourth light extraction pattern 170 may contribute to the improvement of light extraction efficiency at the bottom of the substrate 105 (i.e., the top of a light-emitting device package).

The fourth light extraction pattern 170 may be formed of a different material from the substrate 105. For example, the fourth light extraction pattern 170 may be formed of the same material as the second light extraction pattern 150.

The fourth light extraction pattern 170 may include the same material as the substrate 105. For example, the fourth light extraction pattern 170 may be formed by etching the bottom surface of the substrate 105.

In a related-art light-emitting device, most light is emitted from the bottom of a sapphire substrate. On the other hand, in a light-emitting device according to an embodiment, having the second light extraction pattern 150 formed on the sides of the substrate 105, a considerable amount of light may also be extracted from the sides of the substrate 105.

Also, the amount of light emitted from the chip of the light-emitting device according to an embodiment may increase, and a considerable amount of light may be emitted even from the sides of a sapphire substrate.

Also, simulation results show that the light extraction efficiencies of light-emitting device according to an embodiment achieves light extraction efficiencies of 58.5% and 67.8% before and after a patterning process, respectively, and is expected to achieve an increase of about 16% in luminosity.

The light-emitting device according to an embodiment can improve light extraction efficiency.

Figure 12:
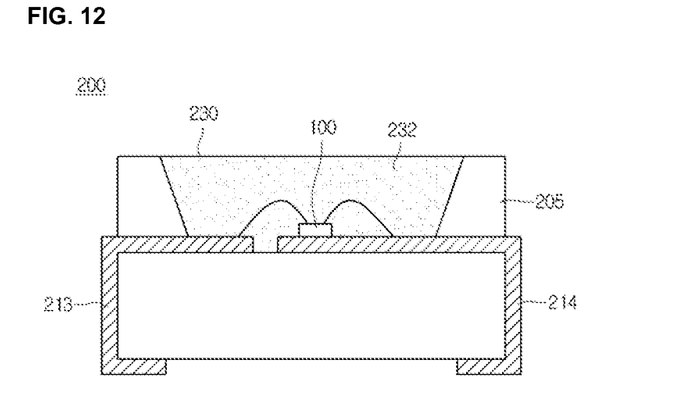
FIG. 12 is a cross-sectional view illustrating a light-emitting device package according to an embodiment.

FIG. 12 is a diagram illustrating a light-emitting device package having a light-emitting device installed therein, according to an embodiment.

A light-emitting device package 200 includes a package body 205, a third electrode layer 213 and a fourth electrode layer 214, which are installed in the package body 205, a light-emitting device 100, which is installed in the package body 205 and is electrically connected to the third electrode layer 213 and the fourth electrode layer 214, and a molding member 230, which surrounds the light-emitting device 100.

The package body 205 may be formed of a silicone material, a synthetic resin material or a metallic material. An inclined surface may be formed near the light-emitting device 100.

The third electrode layer 213 and the fourth electrode layer 214 are electrically isolated from each other, and supply power to the light-emitting device 100. The third electrode layer 213 and the fourth electrode layer 214 may improve light extraction efficiency by reflecting light emitted by the light-emitting device 100. The third electrode layer 213 and the fourth electrode layer 214 may also discharge heat generated by the light-emitting device 100.

A horizontal-type light-emitting device illustrated in FIGS. 1 to 5 may be used as the light-emitting device 100, but the light-emitting device 100 is not limited to the horizontal-type light-emitting device.

The light-emitting device 100 may be installed on the package body 205 or on the third or fourth electrode layer 213 or 214.

The light-emitting device 100 may be electrically connected to the third electrode layer 213 and/or the fourth electrode layer 214 by using at least one of wire, a flip chip method or a die bonding method. For example, the light-emitting device 100 may be connected to the third electrode layer 213 and the fourth electrode layer 214 by wire, as illustrated in FIG. 12.

The molding member 230 may protect the light-emitting device 100 by surrounding the light-emitting device 100. The molding member 230 may include a phosphor 232 and may thus change the wavelength of light emitted from the light-emitting device 100.

In an embodiment, a plurality of light-emitting device packages may be arrayed on a substrate, and a light guide plate, a prism sheet, a diffusion sheet and a phosphor sheet, which are optical elements, may be disposed along the path of light emitted from the light-emitting device packages. In this embodiment, the light-emitting device packages, the substrate, and the optical elements may collectively serve as a backlight unit or a lighting unit. For example, a lighting system may include a backlight unit, a lighting unit, an instruction device, a lamp, a streetlamp, etc.

Figure 13:
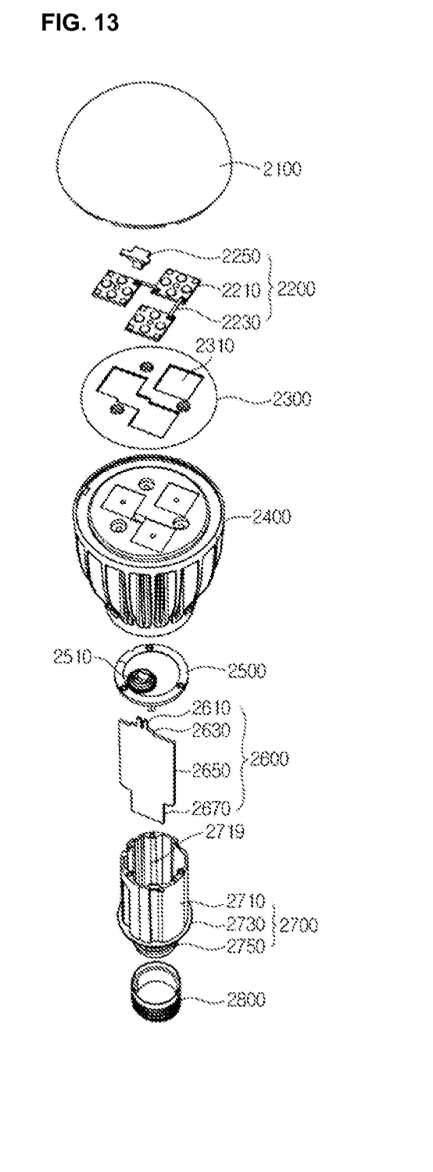
FIG. 13 is an exploded perspective view of a lighting apparatus having a lighting device, according to an embodiment.

FIG. 13 is an exploded perspective view illustrating a lighting apparatus having a lighting device, according to an embodiment.

Referring to FIG. 13, a lighting apparatus may include a cover 2100, a light source module 2200, a heat sink 2400, a power source 2600, an inner case 2700 and a socket 2800. The lighting apparatus may also include at least one of a member 2300 and a holder 2500. The light source module 2200 may include a light-emitting device or a light-emitting device package according to an embodiment.

For example, the cover 2100 may have a bulb shape or a hemispherical shape with a hollow inside and with part thereof open. The cover 2100 may be optically coupled to the light source module 2200, and may also be coupled to the heat sink 2400. The cover 2100 may be provided with a coupling unit for being coupled to the heat sink 2400.

A milk-white paint containing may be coated on the inside of the cover 2100. By using such milk-white material, it is possible to effectively scatter and diffuse light emitted from the light source module 220 and thus to emit the light.

The cover 2100 may be formed of glass, plastic, polypropylene (PP), polyethylene (PE), polycarbonate (PC), etc. PC, in particular, is a material with excellent light fastness, heat resistance and rigidity. The cover 2100 may be transparent so that the light source module 2200 may be seen therethrough. Alternatively, the cover 2100 may be opaque. The cover 2100 may be formed by blow molding.

The light source module 2200 may be disposed on one side of the heat sink 2400. Accordingly, heat from the light source module 2200 may be transferred to the heat sink 2400. The light source module 2200 may include a plurality of light-emitting devices 2210, a plurality of connecting plates 2230 and a connector 2250.

The member 2300 may be disposed at the top of the heat sink 2400, and may include a plurality of guide grooves 2310 into which the light-emitting devices 2210 and the connector 2250 are respectively inserted. The guide grooves 2310 correspond to the substrates of the light-emitting devices 2210 and the connector 2250.

The surface of the member 2300 may be coated with a white paint. The member 2300 reflects light reflected from the inside of the cover 2100 toward the light-emitting module 2200 back to the cover 2100. Accordingly, the efficiency of the lighting apparatus may be improved.

For example, the member 2300 may be formed of an insulating material. The connecting plates 2230 of the light source module 2200 may include an electrically conductive material. Accordingly, the heat sink 2400 may be electrically connected to the connecting plates 2230. The member 2300, which is formed of an insulating material, may prevent the connecting plates 2230 and the heat sink 2400 from being short-circuited. The heat sink 2400 receives heat from the light source module 2200 and the power source 2600 and thus radiates heat.

The holder 2500 closes a receiving groove 2719 of an insulating portion 2710 of the inner case 2700. As a result, the power source 2600, which is disposed in the insulating portion 2710 of the inner case 2700, is sealed. The holder 2500 has a guide a protrusion 2510. The guide protrusion 2510 may be provided with a hole through which a protrusion 2610 of the power source 2600 penetrates.

The power source 2600 processes or converts an electrical signal provided by an external source and provides the processed or converted electrical signal to the light source module 2200. The power source 2600 is disposed in the receiving groove 2719 of the inner case 2700, and is sealed within the inner case 2700 by the holder 2500.

The power source 2600 may include the protrusion 2610, a guide 2630, a base 2650, and an extension 2670.

The guide 2630 is formed to extend from one side of the base 2650 toward the outside of the power source 2600. The guide 2630 may be inserted into the holder 2500. Various parts may be disposed on one side of the base 2650. The various parts may include, but are not limited to, a direct current (DC) converter, a driving chip for controlling the driving of the light source module 2200, an electrostatic discharge (ESD) protection device for protecting the light source module 2200, etc.

The extension 2670 protrudes from one side of the base 2650 toward the outside of the power source 2600. The extension 2670 is inserted into the connecting portion 2750 of the inner case 2700, and is provided with an electrical signal by an external source. For example, the width of the extension 2670 may be the same as or smaller than the width of the connecting portion 2750. The extension 2670 may be electrically connected to the socket 2800 by wire.

The inner case 2700 may include a molding portion in addition to the power source 2600. The molding portion is obtained by hardening a molding liquid, and allows the power source 2600 to be fixed inside the inner case 2700.

A light-emitting device, a method of fabricating the light-emitting device, a light-emitting device package and a lighting system according to embodiments may improve light extraction efficiency.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A light-emitting device comprising:
   a substrate;
   a first conductivity type semiconductor layer disposed on the substrate;
   an active layer disposed on the first conductivity type semiconductor layer;
   a second conductivity type semiconductor layer disposed on the active layer;
   a first electrode disposed on the first conductivity type semiconductor layer;
   a second electrode disposed on the second conductivity type semiconductor layer;
   a first light extraction pattern provided on a top surface of the substrate; and
   a second light extraction pattern provided on sides of the substrate,
   wherein the second light extraction pattern comprises at least a fourth pattern and a fifth pattern, and the fourth pattern and the fifth pattern have different shapes to provide an optimum optical extraction condition by providing a light extraction structure with patterns of various periods and heights.

2. The light-emitting device of claim 1, wherein the first light extraction pattern comprises the same material as the substrate, and the second light extraction pattern comprises a different material from the substrate, and
   wherein the first light extraction pattern includes a hemispherical shape, and the fourth pattern and the first light extraction pattern have different shapes and heights.

3. The light-emitting device of claim 1, wherein a refractive index of the second light extraction pattern is greater than a refractive index of the substrate.

4. The light-emitting device of claim 3, wherein the second light extraction pattern comprises a silicone material.

5. The light-emitting device of claim 1, wherein the second light extraction pattern is formed of a transmissive material.

6. The light-emitting device of claim 1, wherein the second light extraction pattern comprises a plurality of patterns, and the plurality of patterns have different sizes and shapes.

7. The light-emitting device of claim 1, wherein the fourth pattern is larger in size than the fifth pattern, and the fourth pattern is disposed closer than the fifth pattern to the active layer.

8. The light-emitting device of claim 1, wherein the fourth pattern includes a triangular shape, and the fifth pattern includes a hemispherical shape.

9. The light-emitting device of claim 1, wherein the size of the second light extraction pattern is about 1/10 to about 1/5 of the thickness of the substrate.

10. The light-emitting device of claim 1, wherein the fifth pattern is formed more densely than the fourth pattern.

11. The light-emitting device of claim 1, wherein the fourth pattern is vertically misaligned with the first light extraction pattern.

12. The light-emitting device of claim 1, wherein the fifth pattern is vertically misaligned with the first light extraction pattern.

* * * * *